United States Patent
Tseng et al.

(10) Patent No.: US 11,923,466 B2
(45) Date of Patent: Mar. 5, 2024

(54) PHOTODETECTOR WITH INTEGRATED REFLECTIVE GRATING STRUCTURE

(71) Applicant: InnoLight Technology (Suzhou) LTD., Jiangsu (CN)

(72) Inventors: Chih-Kuo Tseng, Jiangsu (CN); Guoliang Chen, Jiangsu (CN); Xiaoyao Li, Jiangsu (CN); Yuzhou Sun, Jiangsu (CN); Yue Xiao, Jiangsu (CN)

(73) Assignee: INNOLIGHT TECHNOLOGY (SUZHOU) LTD., Suzhou (CN)

( * ) Notice: Subject to any disclaimer, the term of this patent is extended or adjusted under 35 U.S.C. 154(b) by 0 days.

(21) Appl. No.: 16/807,622

(22) Filed: Mar. 3, 2020

(65) Prior Publication Data

US 2020/0287064 A1    Sep. 10, 2020

(30) Foreign Application Priority Data

Mar. 7, 2019    (CN) .......................... 201910171483.4

(51) Int. Cl.
| | |
|---|---|
| *H01L 31/0216* | (2014.01) |
| *G02B 5/18* | (2006.01) |
| *H01L 31/0352* | (2006.01) |
| *H01L 31/105* | (2006.01) |
| *H01L 31/18* | (2006.01) |

(52) U.S. Cl.
CPC .................. *H01L 31/02161* (2013.01); *H01L 31/035272* (2013.01); *H01L 31/105* (2013.01); *H01L 31/1804* (2013.01); *H01L 31/1812* (2013.01); *G02B 5/1861* (2013.01)

(58) Field of Classification Search
CPC ....... H01L 31/02161; H01L 31/035272; H01L 31/105; H01L 31/1804; H01L 31/1812; G02B 5/1861
See application file for complete search history.

(56) References Cited

U.S. PATENT DOCUMENTS 4,165,558 A * 8/1979 Armitage, Jr. ........ H01L 31/068
117/9
4,379,943 A * 4/1983 Yang ..................... H01L 31/076
136/249

(Continued)

FOREIGN PATENT DOCUMENTS

| CN | 105070779 A | 11/2015 |
|---|---|---|
| CN | 107665931 A | 2/2018 |
| WO | WO2018100205 A1 * | 6/2018 |

OTHER PUBLICATIONS

Xiankai Sun and Amnon Yariv, "Surface-emitting circular DFB, disk-, and ring-Bragg resonator lasers with chirped gratings: a unified theory and comparative study," Opt. Express 16, 9155-9164 (2008) (Year: 2008).*

*Primary Examiner* — Matthew L Reames
(74) *Attorney, Agent, or Firm* — Finnegan, Henderson, Farabow, Garrett & Dunner, LLP

(57) ABSTRACT

A photodetector with an integrated reflective grating structure includes a substrate, an active layer disposed on the substrate, and a grating structure disposed between the substrate and the active layer. A first doped region is formed on the substrate at a location near the grating structure. A second doped region is formed on a surface of the active layer away from the grating structure. The doping type of the second doped region is different from that of the first doped region.

10 Claims, 8 Drawing Sheets

(56) References Cited

U.S. PATENT DOCUMENTS

| | | | | |
|---|---|---|---|---|
| 4,818,337 A | * | 4/1989 | Barnett | H01L 31/02363 |
| | | | | 136/256 |
| 6,194,721 B1 | * | 2/2001 | Bly | H01L 31/00 |
| | | | | 257/443 |
| 2011/0018086 A1 | * | 1/2011 | Linga | H01L 31/1075 |
| | | | | 257/438 |
| 2014/0060642 A1 | * | 3/2014 | Michel | H01L 31/056 |
| | | | | 438/72 |
| 2016/0268467 A1 | * | 9/2016 | Mills | H01L 31/0687 |

* cited by examiner

US 11,923,466 B2

PHOTODETECTOR WITH INTEGRATED REFLECTIVE GRATING STRUCTURE

CROSS-REFERENCE TO RELATED APPLICATION

This application is based upon and claims priority to Chinese Patent Application 201910171483.4, filed on Mar. 7, 2019, the entire content of which is incorporated herein by reference.

FIELD OF THE DISCLOSURE

The present application relates to the field of optical communication technology and more particularly to a photodetector with an integrated reflective grating structure.

BACKGROUND

A high-performance photodetector is one of the core devices in high-speed optical communication. A normal incident light receiving device provides a significant advantage in spatial light or low power reception, of which optical responsivity and sensitivity are important indicators. However, as demand for bandwidth increases, the RC delay needs to be reduced, or the transit time of photo-generated carriers need to be shortened. When limited optimization of the RC delay is combined with reduction in the optical absorption layer to improve the transit time, optical responsivity suffers.

For optical modules and optical transceivers using silicon photonic technology, in order to solve the problem of spatial optics associated with optical module packaging and to reduce polarization dependent losses (PDL), the portion of the light receiving end is, in most cases, a normal incident germanium photodetector. Spatial light that passes through an optical fiber shines on a large-area normal incident receiver, reducing losses from optical fiber coupling significantly, and increasing the sensitivity and photodetector responsivity of the receiving end. At present, the operating bandwidths of devices are mostly 25 GHz. If the speed of a normal incident photodetector is to be increased, the transit time of the photo-generated carriers must be shortened, and the thickness of the optical absorption layer must be less than 1 μm. However, a thinner optical absorption layer will cause the photodetector responsivity problem due to insufficient optical absorption efficiency.

Recently, an optical resonator has been used to improve optical absorption rate, primarily by adding a high reflectivity mirror in a light receiver. FIG. 1 is a diagram of a conventional photodetector with a distributed Bragg reflector (DBR) structure. As shown in FIG. 1, a plurality of silicon-on-insulator (SOI) layers are repeatedly disposed on a bottom surface of an absorption layer 20' to form the DBR structure. In other words, a plurality of buried insulation layers 12' and top silicon layers 13' are overlaid alternately on a silicon base plate 11' of a substrate 10'. In FIG. 1, two SOI layers are used to form a reflective mirror that reflects approximately 70% to 80%. If greater reflection is needed, then more SOI layers—at least 3 to 4 layers—will be needed. The cost of the manufacturing process of such a structure is extremely high. Additionally, the structure is unable to completely trap incident light in the absorption layer 20', and the absorption rate cannot reach 100%.

FIG. 2 is a diagram of a conventional photodetector with a metal reflective mirror. As shown in FIG. 2, a reflective mirror 30' is formed by making a hole and applying a metal coating below a buried insulation layer 12' on a traditional SOI substrate 10'. The length of a resonant cavity of an optical resonator extends to the reflective surface of the metal reflective mirror 30' to include the thickness of the SOI. Due to limitations of the fabrication technique, when making a hole on the BOX (buried insulation layer 12') of the SOI layer, flatness cannot be guaranteed precisely, causing an approximately 10% error in the thickness of the BOX. In other words, the length of the resonant cavity at different locations varies, resulting in an unstable absorption spectrum. Furthermore, the structure is unable to completely trap incident light in the absorption layer 20', thus the absorption rate cannot reach its optimal level.

SUMMARY

One embodiment of the present disclosure provides a photodetector with an integrated reflective grating structure. The photodetector includes a substrate, an active layer disposed on the substrate, and a grating structure disposed between the substrate and the active layer. A first doped region is formed on the substrate at a location near the grating structure. A second doped region is formed on a surface of the active layer away from the grating structure. The doping type of the second doped region is different from that of the first doped region.

Another embodiment of the present disclosure further provides a method for manufacturing a photodetector with an integrated reflective grating structure. The method includes: providing a substrate; doping the substrate to form a first doped region and producing a grating structure above the first doped region, or, producing a grating structure on the substrate and doping the substrate below the grating structure to form a first doped region; epitaxially growing an active layer on the grating structure; doping an upper portion of the active layer to form a second doped region; and forming a PIN structure from the active layer and the first and second doped regions, the first and second doped regions having different doping types.

DETAILED DESCRIPTION

Figure 1:
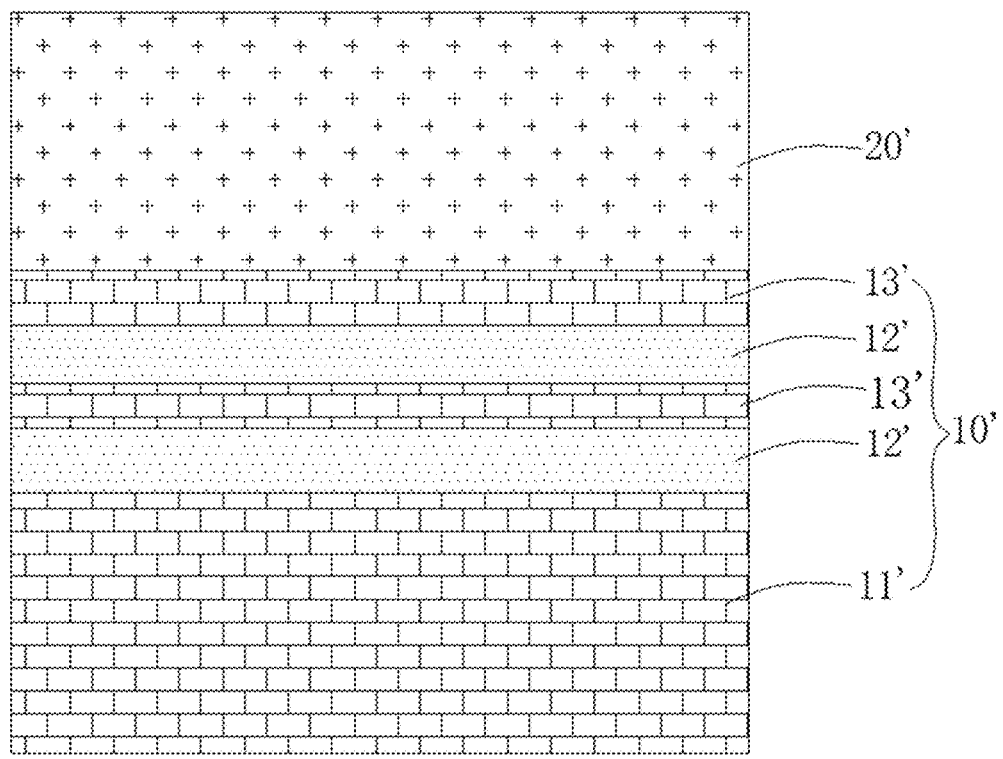
FIG. 1 is a diagram of a conventional photodetector with a distributed Bragg reflector (DBR) structure.
Figure 2:
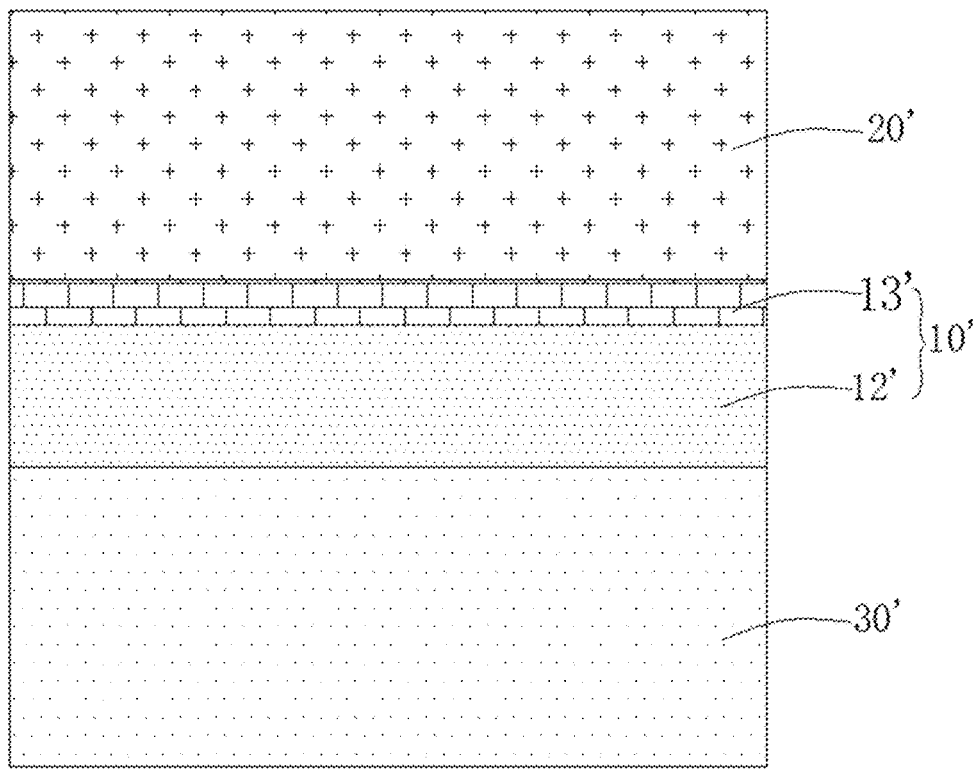
FIG. 2 is a diagram of a conventional photodetector with a metal reflective mirror.

The text below provides a detailed description of the present disclosure with reference to specific embodiments illustrated in the attached drawings. However, these embodiments do not limit the present disclosure. The scope of protection for the present disclosure covers changes made to the structure, method, or function by persons having ordinary skill in the art on the basis of these embodiments.

In order to facilitate the presentation of the drawings in the present disclosure, the sizes of certain structures or portions have been enlarged relative to other structures or portions. Therefore, the drawings in the present disclosure are only for the purpose of illustrating the basic structure of the subject matter of the present disclosure.

Additionally, terms in the text indicating relative spatial position, such as "upper," "above," "lower," "below," and so forth, are used for explanatory purposes in describing the relationship between a unit or feature depicted in a drawing with another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (rotated 90 degrees or facing another direction), and descriptive terms that appear in the text and are related to space should be interpreted accordingly. When a component or layer is said to be "above" another part or layer or "connected to" another part or layer, it may be directly above the other part or layer or directly connected to the other part or layer, or there may be an intermediate component or layer.

Purposes of the present disclosure include providing a photodetector with an integrated reflective grating structure, which features both high bandwidth and high responsivity at the same time.

The photodetector of the present disclosure integrates a reflective grating structure between a substrate and an active layer, thus achieving a nearly total reflection effect, a broader absorption spectrum, and a greater light receiving angle. The photodetector of the present disclosure increases the bandwidth and improves optical responsivity at the same time. Specifically, embodiments of the present disclosure provide a photodetector with an integrated reflective grating structure. The photodetector includes a substrate, an active layer disposed on the substrate, and a grating structure disposed between the substrate and the active layer. A first doped region is formed on the substrate at a location near the grating structure. A second doped region is formed on the active layer away from the grating structure. The first doped region and second doped region are of different doping types, thus forming a PIN junction. The specific structure is explained using examples in the following example embodiments.

First Example Embodiment

Figure 3:
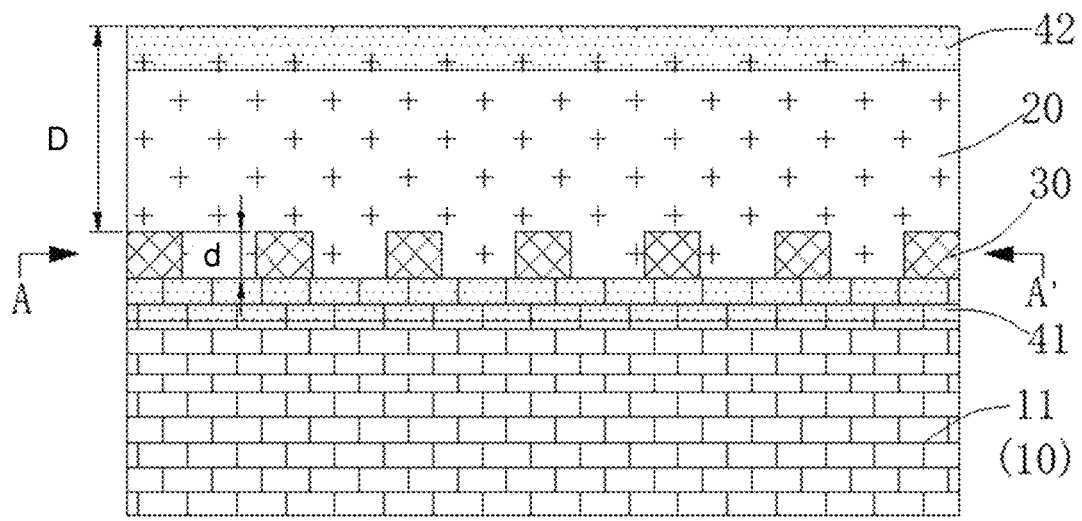
FIG. 3 is a structural diagram of a chip in a photodetector of a first example embodiment of the present disclosure.

FIG. 3 is a structural diagram illustrating a photodetector that integrates a reflective grating structure, according to a first example embodiment of the present disclosure. In the first example embodiment, a grating structure is formed on a dielectric layer to constitute a grating dielectric layer that is stacked on a substrate. Specifically, the detector includes a substrate 10, a grating dielectric layer 30, and an active layer 20 (that is, a light absorption layer) that are stacked sequentially. In this example embodiment, the substrate 10 includes a silicon base plate 11. The grating dielectric layer 30 is disposed on the substrate 10. The active layer 20 extends from the bottom of grating gaps of the grating dielectric layer 30 to above the grating dielectric layer 30 and covers the grating dielectric layer 30. A first doped region 41 is formed by doping the upper portion of the substrate 10 near the grating dielectric layer 30 to serve as a first electrode layer. A second doped region 42 is formed by doping the upper portion of the active layer 20 away from the grating dielectric layer 30 to serve as a second electrode layer. Here, the first doped region 41 may be P-type doping, and the second doped region 42 may be N-type doping. Alternatively, the first doped region 41 may be N-type doping, and the second doped region 42 may be P-type doping.

In the first example embodiment, a thickness D of the portion of the active layer 20 that is higher than the grating dielectric layer 30 is in the range of $0.1\lambda$ to $1\lambda$, $\lambda$ being a central wavelength of the absorption spectrum of the photodetector. In order to further increase the detection speed of the photodetector, that is, to shorten the transit time of photo-generated carriers, the thickness D of the portion of the active layer 20 that is higher than the grating dielectric layer 30 may be set in the range of 50 nm to 1000 nm. For example, the thickness D may be 800 nm, 600 nm, 340 nm, 280 nm, etc. In the first example embodiment, a resonant cavity is formed between the upper and lower surfaces of the active layer 20, that is, between the grating dielectric layer 30 and the upper surface of the active layer 20, to constitute a light absorption layer. A reflective grating structure, that is, the grating dielectric layer 30, is integrated into the bottom of the active layer 20, and the grating structure of the integrated grating dielectric layer 30 enhances the effect of the guided mode resonance enhancement at the bottom surface of the resonant cavity. Therefore, an optical signal that enters into the active layer 20 is trapped in the active layer 20 as it propagates, and the optical signal is then absorbed by the active layer 20, thus achieving a near 100% reflection effect and effectively increasing light absorption efficiency. In the first example embodiment, an optical signal may enter from above the active layer 20 or below the silicon base plate 11.

Figure 4:
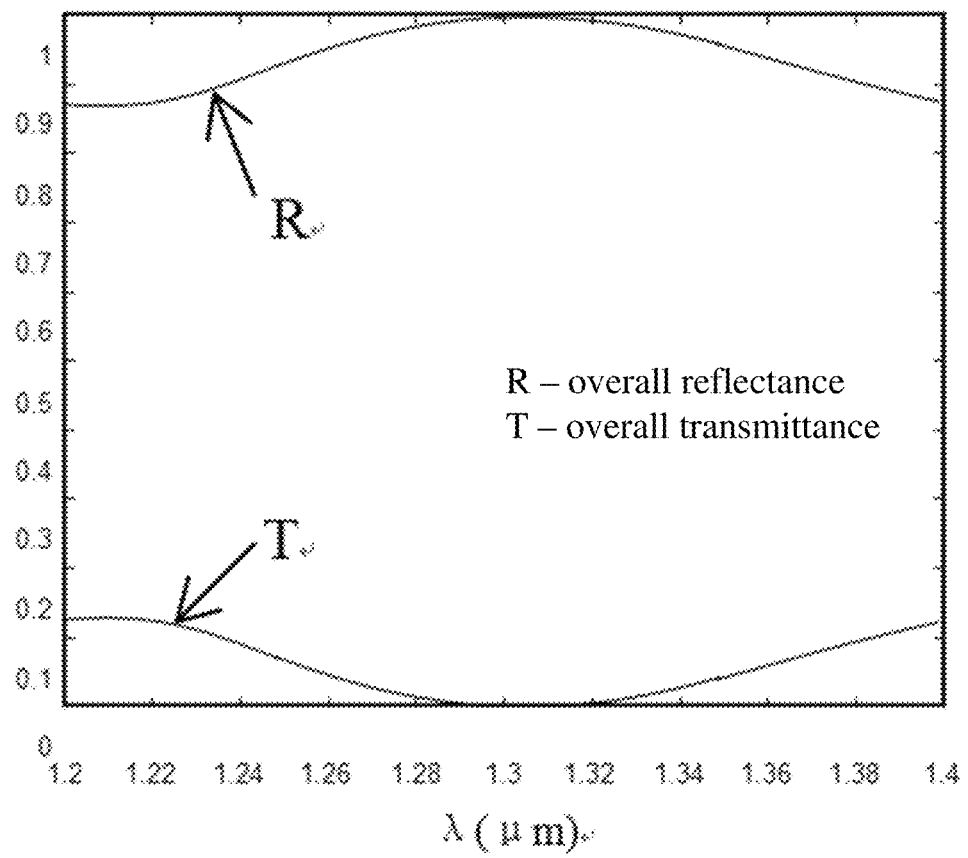
FIG. 4 is a reflectance curve of a photodetector with an integrated reflective grating structure of an embodiment of the present disclosure.
Figure 5:
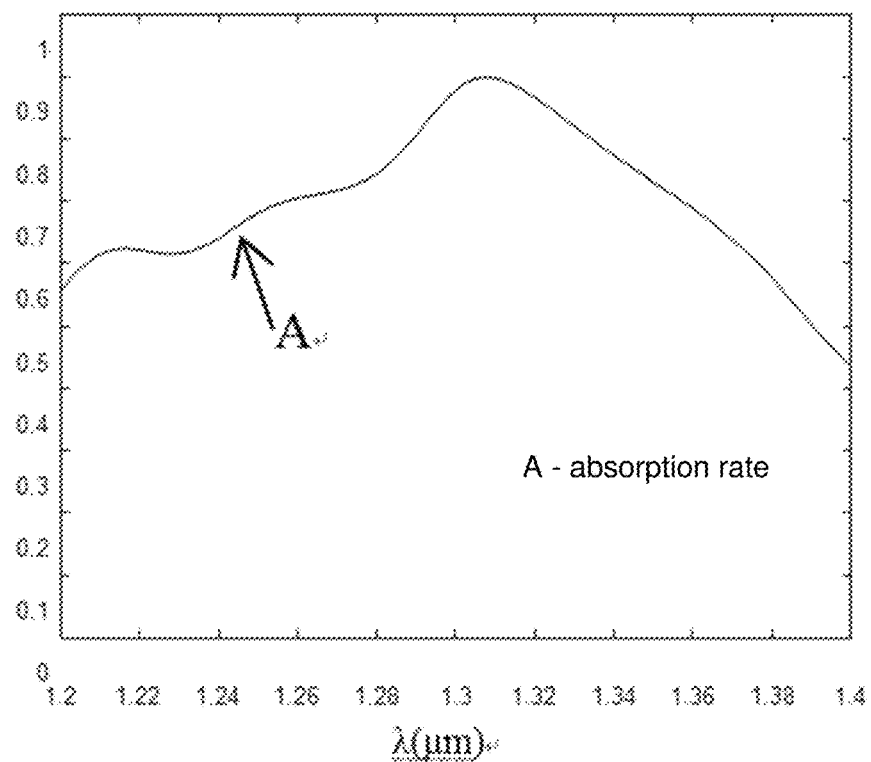
FIG. 5 is an absorption spectrum of a photodetector with an integrated reflective grating structure of an embodiment of the present disclosure.
Figure 6:
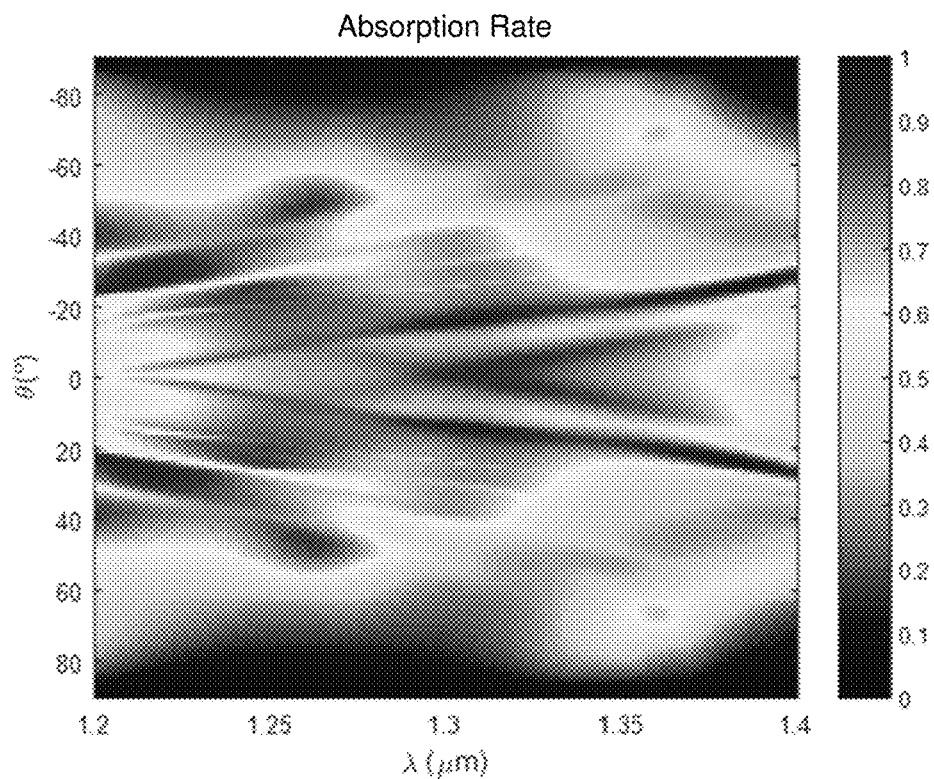
FIG. 6 is a light receiving angle range of a photodetector with an integrated reflective grating structure of an embodiment of the present disclosure.

FIG. 4 shows a light reflectance curve of a photodetector with an integrated reflective grating structure formed according to the first example embodiment. FIG. 5 shows an absorption spectrum of the photodetector of FIG. 4. FIG. 6 shows a light receiving angle range of the photodetector of FIG. 4. The photodetector in these figures includes the grating dielectric layer 30 made of silicon dioxide integrated at the bottom of a 450 nm-thick germanium active layer 20. The thickness of the germanium active layer 20 is the distance between the bottom of the grating gaps and the upper surface of the active layer 20. As can be seen from these figures, around the communication band of 1310 nm, the grating dielectric layer 30 demonstrates a near total reflection effect, a broader absorption spectrum range, which is greater than 100 nm, and a greater light receiving angle, which is approximately between −50° and 50°. The grating dielectric layer 30 can receive not only a perpendicular incident light but also an incident light that deviates within a certain angle range. As a result, the speed and the bandwidth increase, and the optical responsivity improves at the same time. In the first example embodiment, the grating dielectric layer 30 is made of silicon dioxide. The grating has a height of 250 nm, a grating period of 680 nm, and a duty cycle of 0.54. The grating structure of the grating dielectric layer 30 may be designed according to actual needs: the grating height may be adjusted in the range of $0.1\lambda$ to $1\lambda$, the grating period may be adjusted in the range of $0.1\lambda$ to $1\lambda$, and the duty cycle may be adjusted in the range of 0.1 to 0.9, $\lambda$ being the central wavelength of the absorption spectrum of the photodetector.

Figure 7:
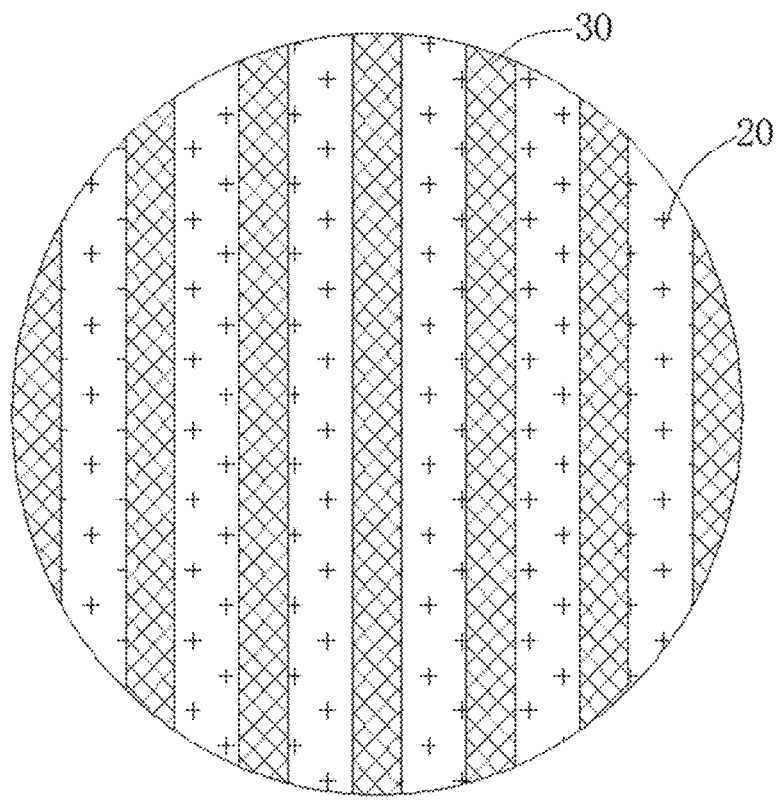
FIG. 7 is a diagram of a first example of a cross section of the structure of FIG. 3 along section A-A'.
Figure 8:
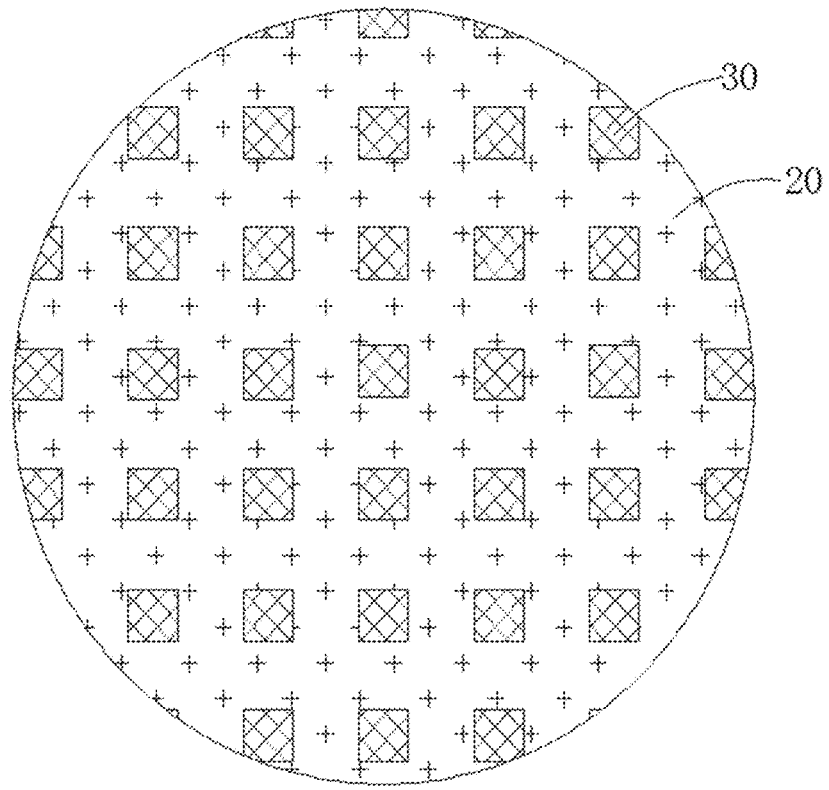
FIG. 8 is a diagram of a second example of a cross section of the structure of FIG. 3 along section A-A'.
Figure 9:
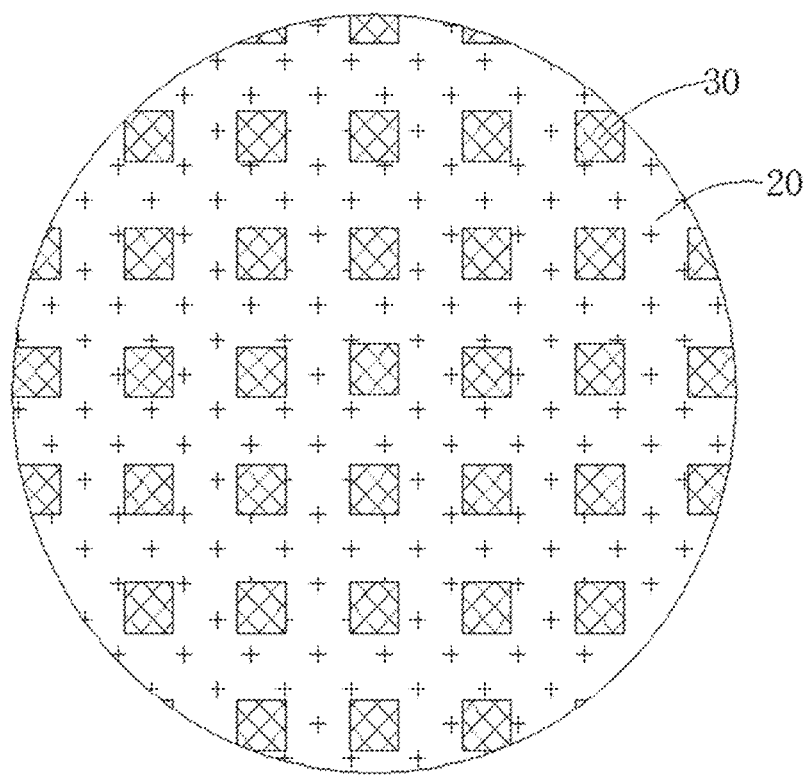
FIG. 9 is a diagram of a third example of a cross section of the structure of FIG. 3 along section A-A'.
Figure 10:
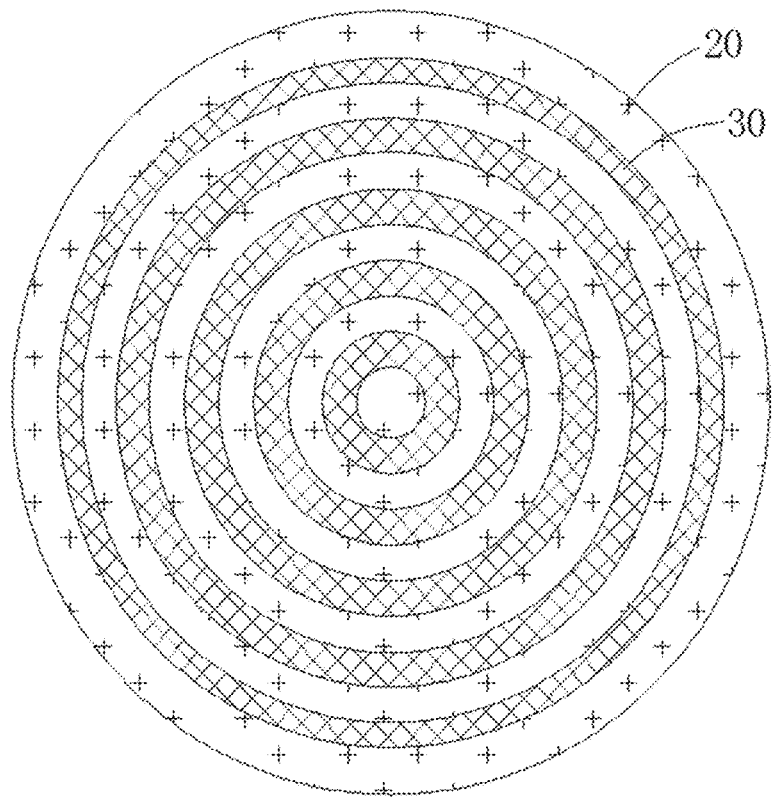
FIG. 10 is a diagram of a fourth example of a cross section of the structure of FIG. 3 along section A-A'.

The active layer 20 is an epitaxial germanium layer. In other example embodiments, the active layer 20 may also be one or more of the following: a silicon layer, a germanium-silicon layer, a germanium layer, or a germanium-tin layer. Here, the germanium-silicon layer is $Si_xGe_{1-x}$, $x \leq 10\%$, and the germanium-tin layer is $Sn_xGe_{1-x}$, $x \leq 10\%$. Similarly, in other example embodiments, the grating dielectric layer 30 may also be made of a dielectric material, such as silicon nitride, whose refractive index is lower than the refractive index of the active layer. In the first example embodiment, the grating of the grating dielectric layer 30 is a one-dimensional grating, as shown in FIG. 7. In other example embodiments, the grating may be a two-dimensional grating, such as a two-dimensional grating that is axisymmetric and/or centrosymmetric, as shown in FIGS. 8 and 9. In a two-dimensional grating, the cross section of each grating unit may be round or polygonal in shape, or each grating unit may be a column or cone of another shape. The grating may also be formed by a plurality of centrosymmetric ring-shaped grating units, as shown in FIG. 10.

At the time of design, the thickness of the active layer is first determined, usually in the range of 50 nm to 1600 nm, in accordance with the detection speed needed and the width or narrowness of the absorption spectrum. Then parameters of the grating are adjusted to obtain optimal reflectance and absorption rate. Depending on application requirements, the detector may be designed to be a wide absorption frequency band detector with an absorption range ($\Delta\lambda_{1\ dB}$) greater than 100 nm or a narrow absorption frequency band detector with an extremely narrow absorption range.

The photodetector with an integrated reflective grating structure may be formed using the method below, which includes the following steps:

providing a substrate;

doping the substrate to form a first doped region, and forming a grating structure above the first doped region;

epitaxially growing an active layer on the grating structure;

doping the upper portion of the active layer to form a second doped region; and forming a PIN structure from the active layer and the first and second doped regions, which are of different doping types.

In the first example embodiment, the upper portion of the substrate is doped to form the first doped region. Next, a dielectric layer is made on the first doped region, and a grating structure is etched on the dielectric layer to form a grating dielectric layer. Then an active layer is epitaxially grown on the grating dielectric layer, and the upper portion of the active layer is doped to form a second doped region.

During the manufacturing process, the grating dielectric layer 30 may be made by epitaxially growing or depositing a dielectric layer on the substrate 10 and then etching the dielectric layer to form the grating structure. Next, epitaxial growth continues on the grating structure to form the active layer 20. When epitaxially growing the active layer 20, the grating dielectric layer 30 plays a role in epitaxial growth and defect blocking, and restricting lattice mismatch defects between the active layer 20 and substrate 10 to be within the grating gaps, thereby reducing dark current in the whole device and improving the quality of the active layer. The manufacturing process of the structure is compatible with semiconductor processing techniques. Wafers do not need to be customized, and the back of the wafers do not need separate processing. The process is simple, the technique is mature, and large quantities can be produced at relatively low cost.

Figure 11:
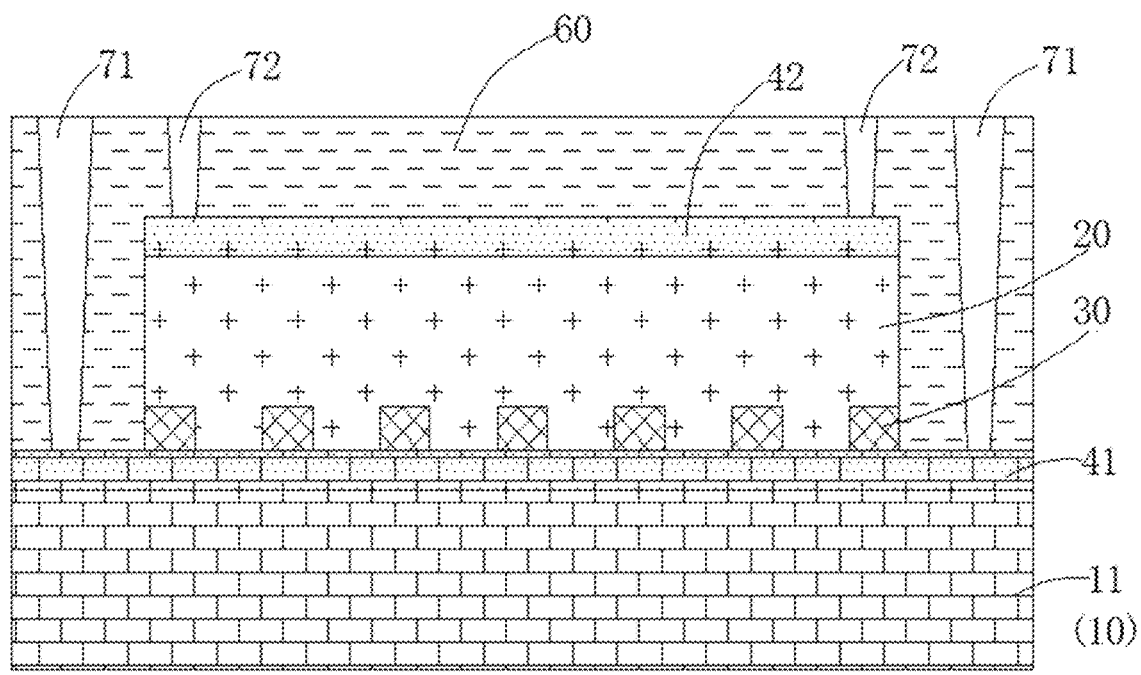
FIG. 11 is a structural diagram of the photodetector of the first example embodiment of the present disclosure.

FIG. 11 is a structural diagram of the photodetector of the first example embodiment of the present disclosure. As shown in FIG. 11, the active layer 20 of the photodetector is further covered by a cladding layer 60. A first conductive channel 71 is disposed in the cladding layer 60 at the periphery of the active layer 20. The first conductive channel 71 is electrically connected to the first doped region 41. A second conductive channel 72 is disposed in the cladding layer 60 above the active layer 20. The second conductive channel 72 is electrically connected to the second doped region 42. The first conductive channel 71 and the second conductive channel 72 are connected to an external positive electrode and an external negative electrode, respectively. The structure illustrated in FIG. 11 is an electrical structure of the photodetector of the present disclosure. Of course, electrical signals from the first doped region 41 and second doped region 42 may be led out by other means. For example, the conductive channels may be arranged on a side so that electrical signals from the first doped region 41 and second doped region 42 are led out from the side. Here, the cladding layer 60 may be a dielectric layer made of materials such as silicon dioxide or silicon nitride that have a refractive index lower than the refractive index of the active layer, so as to enable incident light to have better resonance between the upper surface of the active layer and the grating dielectric layer.

Second Example Embodiment

Figure 12:
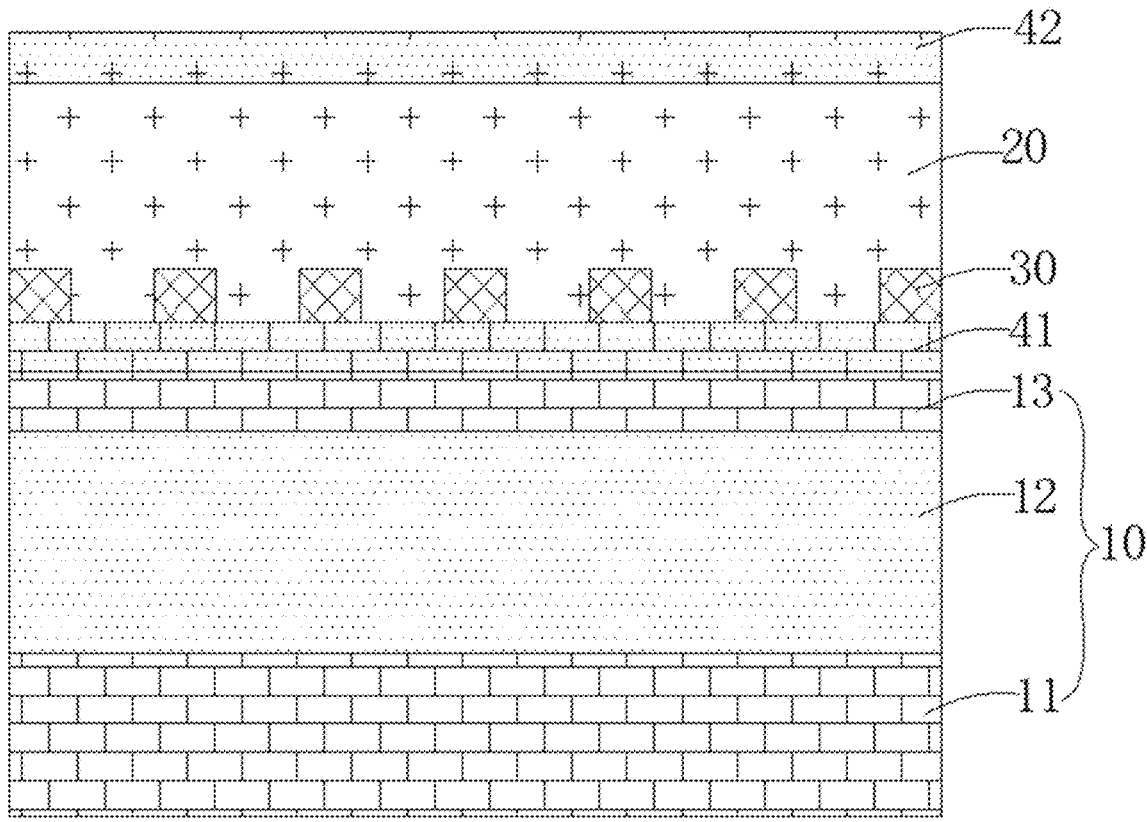
FIG. 12 is a structural diagram of a chip in a photodetector of a second example embodiment of the present disclosure.

FIG. 12 is a structural diagram of a chip in a photodetector in a second example embodiment of the present application. As shown in FIG. 12, Example Embodiment 2 differs from Example Embodiment 1 in that the substrate 10 further includes a buried insulation layer 12 (BOX) and a top silicon layer 13 that are sequentially stacked on the silicon base plate 11. In other words, the substrate 10 in the second example embodiment has an SOI (silicon-on-insulator) structure. A first doped region 41 is formed to serve as the first electrode layer by doping the upper portion of the top silicon layer 13 of the SOI layer. The first doped region 41 and the second doped region 42 on the upper portion of the active layer 20 form a PIN structure. In this example embodiment, since the substrate has an SOI structure, an optical signal enters from above the active layer and cannot enter from below the silicon base plate.

In each of the aforementioned example embodiments, a buffer layer may further be arranged between the grating dielectric layer 30 and the substrate 10. Here, the substrate 10 may be the silicon base plate 11 as in the first example embodiment or may have an SOI structure as in the second example embodiment. The structure of the buffer layer may be as illustrated in the third and fourth example embodiments to be described below.

Third Example Embodiment

Figure 13:
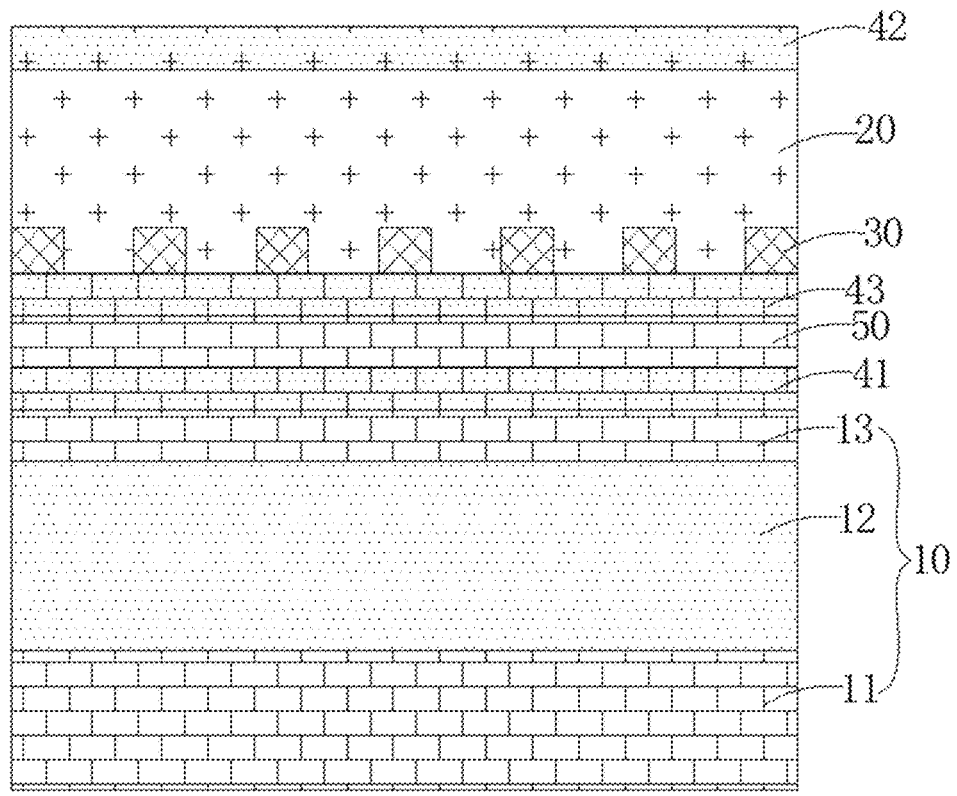
FIG. 13 is a structural diagram of a chip in a photodetector of a third example embodiment of the present disclosure.

FIG. 13 is a structural diagram of a chip in a photodetector of a third example embodiment of the present disclosure. As shown in FIG. 13, in the third example embodiment, the buffer layer is an epitaxial silicon layer 50. The first doped region 41 is disposed on the upper portion of the substrate 10 near the epitaxial silicon layer 50. A third doped region 43 is formed by doping the upper portion of the epitaxial silicon layer 50 near the grating dielectric layer 30. The doping type of the third doped region 43 is the same as that of the second doped region 42. The second doped region 42, third doped region 43, and the first doped region 41 form a PIPIN structure or an NINIP structure. The doped regions are electrically connected to different conductive channels, respectively, to constitute an APD (avalanche photodiode, which is a type of photodetector) of the integrated reflective grating structure.

Fourth Example Embodiment

Figure 14:
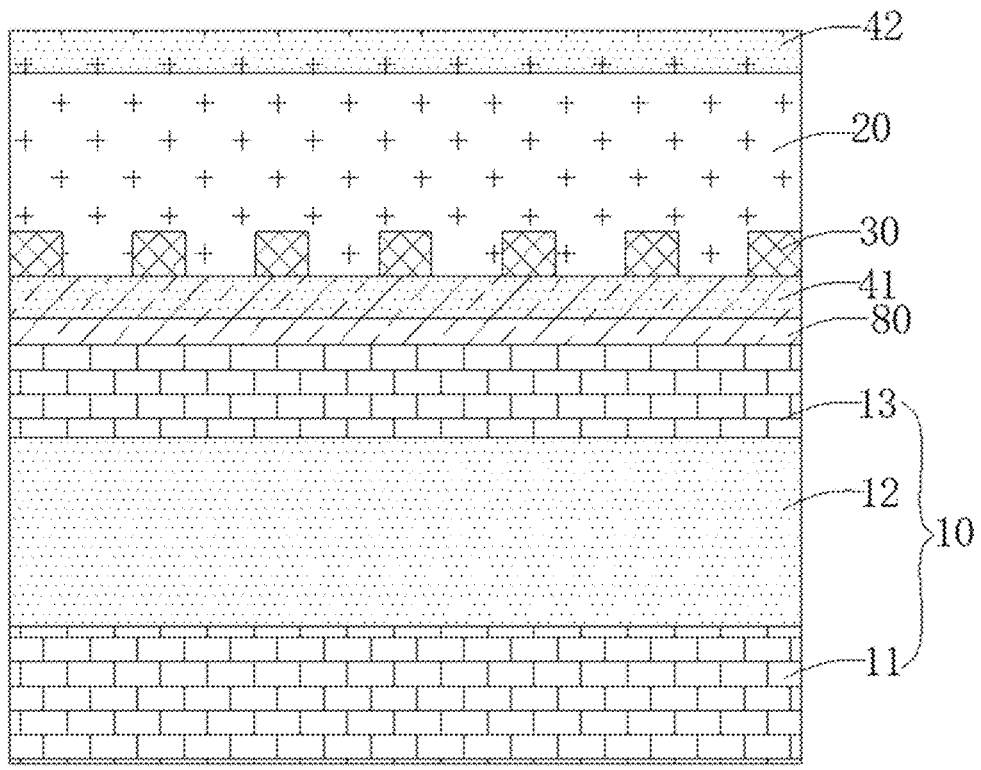
FIG. 14 is a structural diagram of a chip in a photodetector of a fourth example embodiment of the present disclosure.

FIG. 14 is a structural diagram of a chip in a photodetector of the fourth example embodiment of the present disclosure. As shown in FIG. 14, the buffer layer in the fourth example embodiment is a dielectric layer 80 that is crystallized or monocrystalline. The first doped region 41 includes the dielectric layer 80, or the first doped region 41 is disposed on the upper portion of this dielectric layer 80 near the grating dielectric layer 30. In other words, the first doped region 41 is formed on the dielectric layer 80 at a location near the grating dielectric layer 30. Depending on the thickness of the dielectric layer 80, the doping depth of the first doped region 41 may reach just the upper portion of the dielectric layer 80, may be the same as the thickness of the entire dielectric layer 80, or may penetrate down to the upper portion of the substrate 10. In the fourth example embodiment, the dielectric layer 80 that serve as the buffer layer may be made of a crystallized or monocrystalline material such as silicon, germanium-silicon, or germanium. It can play the role of adjusting the optical refractive index or, as an epitaxial buffer layer, play the role of improving the epitaxial growth quality.

Fifth Example Embodiment

Figure 15:
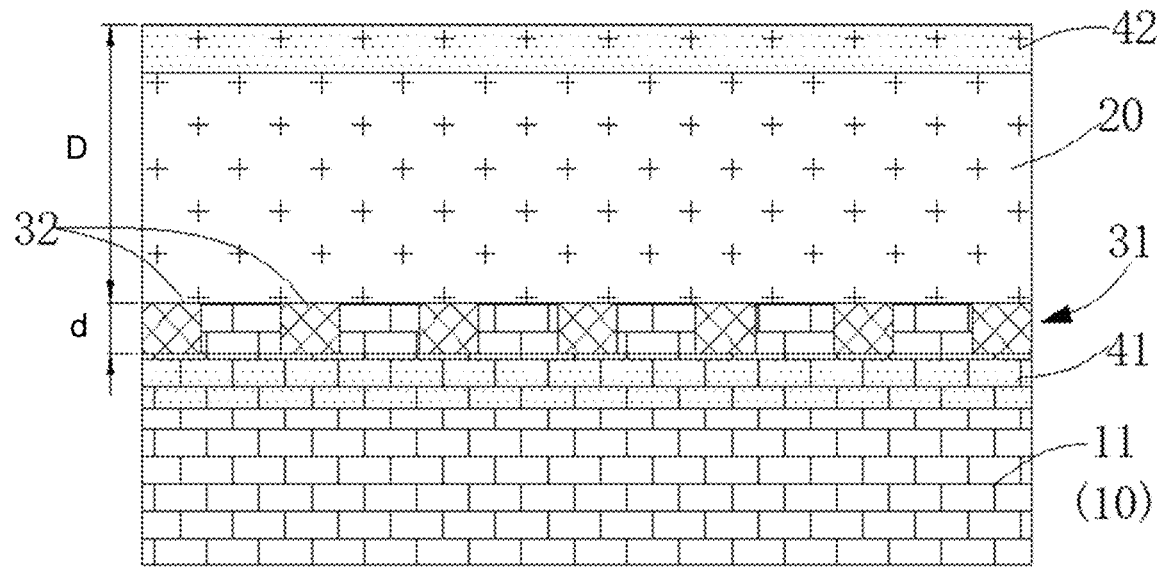
FIG. 15 is a structural diagram of a chip in a photodetector of a fifth example embodiment of the present disclosure.

FIG. 15 is a structural diagram of a chip in a photodetector of a fifth example embodiment of the present disclosure. As shown in FIG. 15, the fifth example embodiment differs from all of the aforementioned example embodiments in that the photodetector with an integrated reflective grating structure includes a substrate 10 and an active layer 20 disposed on the substrate 10, wherein the substrate 10 includes at least one silicon layer. In this example embodiment, the silicon layer is the silicon base plate 11, and a grating structure 31 is formed on the surface of this silicon base plate 11 near the active layer 20. The first doped region 41 is formed on the silicon base plate 11 below this grating structure 31, and the second doped region 42 is formed on the upper portion of the active layer 20 away from the grating structure 31. The second doped region 42 and the first doped region 41 have different doping types and form a PIN structure. The mechanism of operation of the photodetector in the fifth example embodiment is the same as that in the first example embodiment. Therefore, no details are repeated here.

In the fifth example embodiment, a dielectric material, such as silicon oxide, whose refractive index is lower than that of the silicon base plate, is disposed in grating gaps 32 of the grating structure 31. In the manufacturing process, the grating structure 31 may be formed by etching on the silicon base plate 11. Next, a dielectric material whose refractive index is lower than that of silicon is filled or deposited in the grating gaps 32 using a semiconductor fabrication technique such as STI (shallow trench isolation). Then, the active layer 20 is epitaxially grown on the grating structure 31. The first doped region 41 may be formed by doping the silicon base plate 11 using a method such as ion implantation before the etching of the grating structure 31. The first doped region 41 may also be formed by doping the silicon base plate 11 after etching the grating structure 31.

Sixth Example Embodiment

Figure 16:
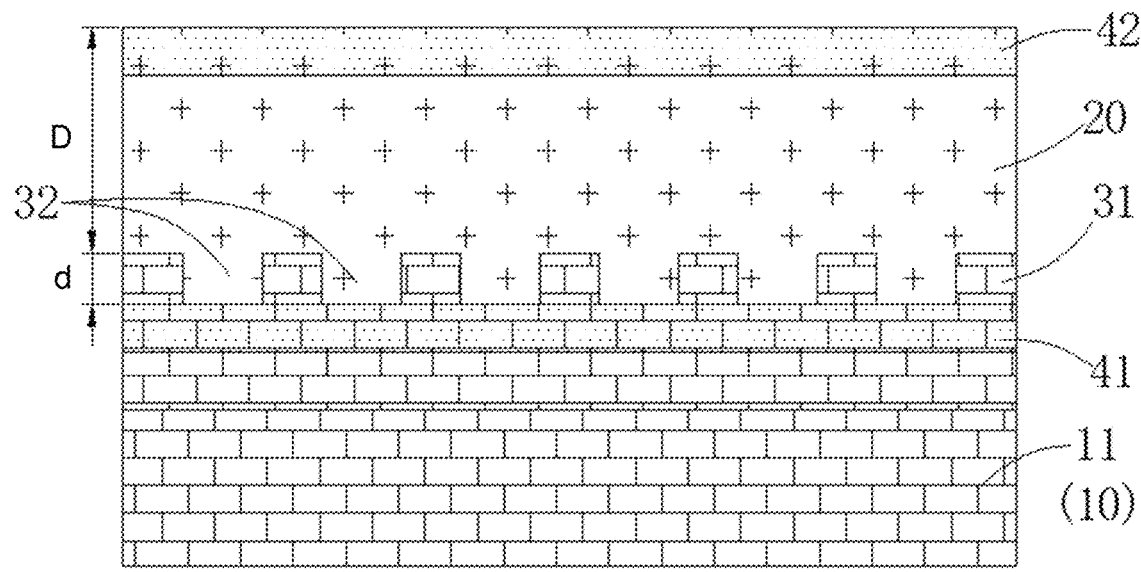
FIG. 16 is a structural diagram of a chip in a photodetector of a sixth example embodiment of the present disclosure.

FIG. 16 is a structural diagram of a chip in a photodetector of a sixth example embodiment of the present disclosure. The photodetector shown in FIG. 16 differs from that of the fifth example embodiment in that no dielectric material is added to the grating gaps 32 of the grating structure 31. Instead, the active layer 20 extend from the bottom of the grating gaps 32 of the grating structure 31 to above the grating structure 31, thereby removing the step of filling or depositing a dielectric material and simplifying the production process.

In the fifth and sixth example embodiments, a low doped region may further be formed on the upper portion of the silicon layer that forms the grating structure. The doping concentration of this low doped region is lower than or equal to that of the low doped region of the aforementioned first doped region, and the doping type of this low doped region is the same as that of the first doped region. Here, the doping concentration of the low doped region is in the range of $1 \times 10^{15}$ cm$^{-3}$ to $1 \times 10^{19}$ cm$^{-3}$.

In each of the aforementioned example embodiments, an antireflection film may further be coated on the incidence plane of the active layer to reduce optical insertion loss and further improve optical responsivity.

Embodiments of the present disclosure provide the following benefits. The photodetector of the present disclosure integrates a reflective grating structure between a substrate and an active layer, thus achieving a nearly total reflection effect, a broader absorption spectrum, and a greater light receiving angle. The photodetector of the present disclosure increases the bandwidth and improves optical responsivity at the same time.

The series of detailed descriptions above is only intended to provide specific descriptions of feasible embodiments of the present disclosure. They are not to be construed as limiting the scope of protection for the present disclosure. All equivalent embodiments or changes that are not detached from the techniques of the present disclosure in essence should fall under the scope of protection of the present claims.

What is claimed is:

1. A photodetector with an integrated reflective grating structure, comprising:
   a substrate;
   an active layer disposed on the substrate;

a grating structure disposed between the substrate and the active layer;

a first doped region formed by doping the substrate at a location near the grating structure; and a second doped region formed by doping a portion of the active layer at a location away from the grating structure, wherein the doping type of the second doped region is different from that of the first doped region, the active layer is a germanium layer, the grating structure is disposed on top of the first doped region and at the bottom of the active layer, a portion of the active layer is higher than the grating structure, and the active layer is an epitaxial layer epitaxially grown on the substrate with the grating structure formed on the substrate.

2. The photodetector of claim 1, wherein the grating structure is a grating dielectric layer.

3. The photodetector of claim 2, wherein the material of the grating dielectric layer is a dielectric material whose refractive index is lower than a refractive index of the active layer.

4. The photodetector of claim 1, wherein the substrate comprises at least one silicon layer, and the grating structure is formed on the surface of the silicon layer near the active layer.

5. The photodetector of claim 4, wherein the active layer extends from the bottom of grating gaps of the grating structure to above the grating structure.

6. The photodetector of claim 4, wherein a dielectric material whose refractive index is lower than a refractive index of the silicon layer is disposed in grating gaps of the grating structure.

7. The photodetector of claim 1, wherein the grating structure is a one-dimensional grating or two-dimensional grating.

8. A method for manufacturing a photodetector with an integrated reflective grating structure, comprising:

providing a substrate;

doping the substrate to form a first doped region and forming a grating structure above the first doped region, or, forming a grating structure on the substrate and doping the substrate below the grating structure to form a first doped region;

epitaxially growing a germanium layer as an active layer on the substrate with the grating structure formed on the substrate;

doping an upper portion of the epitaxially grown active layer to form a second doped region; and forming a PIN structure from the active layer and the first and second doped regions, the first and second doped regions having different doping types, wherein the grating structure is disposed on top of the first doped region and at the bottom of the active layer, and a portion of the active layer is higher than the grating structure.

9. The photodetector of claim 1, wherein the grating structure is a two-dimensional grating including a plurality of grating units each having a round cross-sectional shape, a two-dimensional grating including a plurality of grating units each having a polygonal cross-sectional shape, or a two-dimensional grating including a plurality of centrosymmetric ring-shaped grating units.

10. The photodetector of claim 1, wherein the substrate comprises a silicon base plate, a buried insulation layer, and a top silicon layer, and the buried insulation layer and the top silicon layer are sequentially stacked on the silicon base plate.

* * * * *